US005592641A

United States Patent [19]
Fandrich et al.

[11] Patent Number: 5,592,641
[45] Date of Patent: Jan. 7, 1997

[54] METHOD AND DEVICE FOR SELECTIVELY LOCKING WRITE ACCESS TO BLOCKS IN A MEMORY ARRAY USING WRITE PROTECT INPUTS AND BLOCK ENABLED STATUS

[75] Inventors: Mickey L. Fandrich, Placerville; Salim B. Fedel, Folsom; Thomas C. Price, Fair Oaks; Richard J. Durante, Citrus Heights; Geoffrey A. Gould, El Dorado Hills; Timothy W. Goodell, Elk Grove; Scott M. Doyle, Citrus Heights, all of Calif.

[73] Assignee: Intel Corporation, Santa Clara, Calif.

[21] Appl. No.: 85,546

[22] Filed: Jun. 30, 1993

[51] Int. Cl.[6] ........................................ G06F 12/14
[52] U.S. Cl. .................. 395/430; 395/479; 395/483; 395/490; 365/185.04; 365/185.11; 365/195
[58] Field of Search ................................. 395/425, 430, 395/479, 490, 482, 483; 365/900, 185.04, 185.11, 195

[56] References Cited

U.S. PATENT DOCUMENTS

| | | | |
|---|---|---|---|
| 4,561,051 | 12/1985 | Rodman et al. | 395/482 |
| 4,783,745 | 11/1988 | Brookner et al. | 364/464.02 |
| 5,053,990 | 10/1991 | Kreifels et al. | 395/430 |
| 5,065,364 | 11/1991 | Atwood et al. | 365/185.13 |
| 5,159,672 | 10/1992 | Salmon et al. | 395/494 |
| 5,175,837 | 12/1992 | Arnold et al. | 395/479 |
| 5,177,745 | 1/1993 | Rozman | 371/21.1 |
| 5,222,046 | 6/1993 | Kreifels et al. | 365/185.22 |
| 5,224,070 | 6/1993 | Fandrich | 365/185.33 |
| 5,233,559 | 8/1993 | Brennan, Jr. | 365/185.09 |
| 5,245,572 | 9/1993 | Kosonocky et al. | 365/185.11 |
| 5,249,158 | 9/1993 | Kynett et al. | 365/185.11 |
| 5,265,059 | 11/1993 | Wells et al. | 365/185.25 |
| 5,388,083 | 2/1995 | Assar et al. | 365/185.33 |

FOREIGN PATENT DOCUMENTS 62-283496   12/1987   Japan .

Primary Examiner—Eddie P. Chan
Assistant Examiner—Reginald G. Bragdon
Attorney, Agent, or Firm—Blakely, Sokoloff, Taylor & Zafman

[57] ABSTRACT

A method and device for selectively enabling and disabling write access to flash blocks in a flash memory device. A lock command locks and unlocks a flash block in a flash array containing a plurality of flash blocks. A block data row decoder selects a block data area of the flash block, and a block status row decoder selects a block status area of the flash block. A lock bit in the block status area is programmed to a first logic state if the lock command specifies a lock flash block operation, or to a second logic state if the lock command specifies a release flash block operation. If a write protect input, read from the write protect pin of the flash memory device, indicates that a write lock is enabled and if a block enabled status bit in a block status register corresponding to the block indicates that the block has the write lock, then the lock bit is read and stored into the block enabled status bit in the block status register corresponding to the block. The write protect input is read again from the write protect pin and if the write protect input indicates that the write lock is enabled, and if the block enabled status bit in the block status register corresponding to the block, as updated, indicates that the block has the write lock, then an error is signaled.

35 Claims, 7 Drawing Sheets

METHOD AND DEVICE FOR SELECTIVELY LOCKING WRITE ACCESS TO BLOCKS IN A MEMORY ARRAY USING WRITE PROTECT INPUTS AND BLOCK ENABLED STATUS

BACKGROUND OF THE INVENTION

1. Field of the Invention

The present invention pertains to the field of integrated circuit memory devices. More particularly, this invention relates to a mechanism for selectively locking flash cell blocks in a flash memory device.

2. Art Background

A flash memory device contains a flash cell array for nonvolatile random access data storage in a computer system. A typical flash memory device implements a write control circuit for programming and erasing selected areas of the flash cell array. The write control circuit programs and erases the flash cells by applying a predetermined sequence of program level voltages to the flash cells. A typical flash cell array is subdivided into a set of flash cell blocks. The write control circuit may program/erase an entire flash cell block in a single operation, or program/erase a portion of a flash cell block.

However, the programs and data stored in the flash cell array are vulnerable to inadvertent program/erase operations. Inadvertent program/erase operations may be caused by a software bug in the computer system. In addition, inadvertent program/erase operations may be caused by hardware errors in the computer system. An inadvertent program/erase operation can destroy critical programs and data stored in the flash cell array.

Prior flash devices protected portions of the flash cell array from inadvertent program/erase operations by allocating a small protected area of the flash cell array for critical program and data storage. The protected area of the flash cell array is typically used to protect programs and data for system boot operations.

Usually in such prior flash devices, the protected area of the flash cell array cannot be programmed or erased unless a preselected pin of the flash device is driven to a high voltage level. For example, in a typical 5 volt flash device, a program/erase operation to the protected area is enabled by driving the preselected pin to 12 volts.

Unfortunately, such prior flash devices usually provide write protection for only a small area of the flash array. Moreover, the external circuitry required to drive the preselected pin to the high voltage level increases the overall cost and power consumption of the memory system containing such prior flash device.

SUMMARY AND OBJECTS OF THE INVENTION

One object of the present invention is to protect flash cell blocks of a flash cell array in a flash memory device from inadvertent program or erase operations.

Another object of the present invention is to enable selective locking and unlocking of all flash cell blocks of a flash array to protect the flash cell blocks from inadvertent program or erase operations.

Another object of the present invention is to enable a user to access block status registers in the flash memory device to determine whether the flash cell blocks are enabled or locked.

Another object of the present invention is to provide a block status area in each flash cell block for non volatile storage of a flash cell lock information.

A further object of the present invention is to provide the block status area by appending status rows to each block data area of the flash cell array.

These and other objects of the invention are provided by a method and apparatus for selectively enabling and disabling write access to flash cell blocks in a flash memory device. A lock control command is received over a host bus. The lock control command specifies a flash cell block in a flash array containing a plurality of flash cell blocks. The lock control command specifies a lock flash block operation. A block data row decoder for a block data area of the flash cell block is disabled, and a block status row decoder for a block status area of the flash cell block is enabled. A lock cell in the block status area is programmed to a first logic state.

A write access command is received targeted for the flash cell block, wherein the write access command causes a program or erase operation on the flash cell block. A locked flag is generated by combining the state of a write protect pin with a block enabled status bit from a block status register corresponding to the flash cell block. If the locked flag is in the first state, a lock bit is read from the lock cell and stored into the block enabled status bit of the block status register corresponding to the flash cell block. Thereafter, if the locked flag is still in the first state, an error is signaled. If the locked flag is in a second state then the program or erase operation continues.

An erase operation on the flash cell block releases the flash cell block by erasing the lock cell to a second state logic state. A power-on sequence in the flash memory device sets the block enabled status bit in each block status register to the second state to initially disable the flash cell blocks.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION OF THE INVENTION

Figure 1:
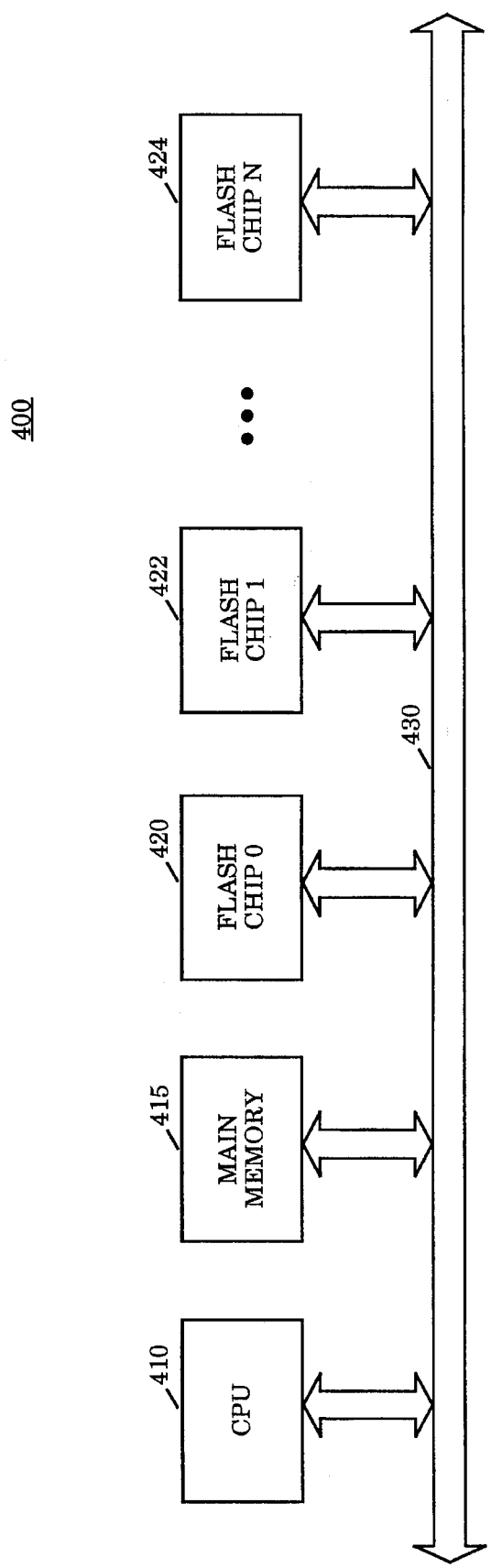
FIG. 1 is a block diagram of a computer system including a central processing unit (CPU), a main memory subsystem, and a set of flash memory devices.

FIG. 1 is a block diagram of a computer system 400. The computer system 400 is comprised of a central processing unit (CPU) 410, a main memory subsystem 415, and a set of flash memory devices 420–424. The CPU 410 communicates with the main memory subsystem 415 and the flash memory devices 420–424 over a host bus 430.

The flash memory devices 420–424 provide random access non volatile large scale data storage for the computer system 400. The CPU 410 reads the contents of the flash memory devices 420–424 by generating read memory cycles over the host bus 430. The CPU 410 writes to the flash memory devices 420–424 by transferring write commands and write data blocks to the flash devices 420–424 over the host bus 430.

Figure 2:
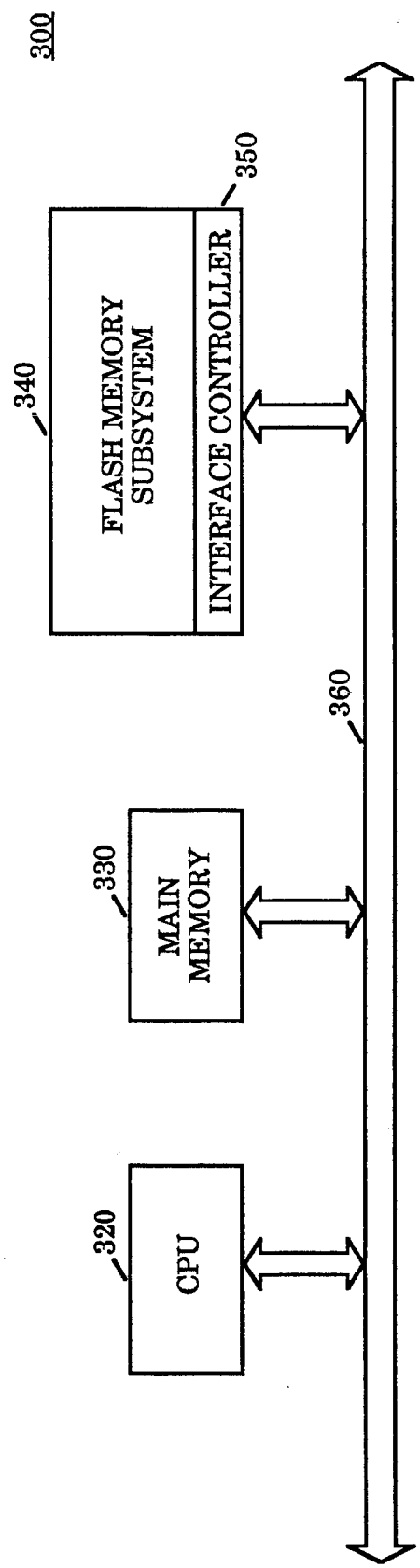
FIG. 2 is a block diagram of a computer system comprising a CPU, a main memory subsystem, and a flash memory subsystem.

FIG. 2 is a block diagram of a computer system 300. The computer system 300 is comprised of a central processing unit (CPU) 320, a main memory subsystem 330, and a flash memory subsystem 340. The flash memory subsystem 340 includes an interface controller 350. The CPU 320, the main memory subsystem 330, and the flash memory subsystem 340 communicate over a host bus 360. The interface controller 350 enables access of the flash memory subsystem 340 over the host bus 360.

The flash memory subsystem 340 is comprised of a set of flash memory devices such as the flash memory device 420 described above. The interface controller 350 receives access requests for the flash memory subsystem 340 over the host bus 360. The interface controller 350 maps the access requests to the appropriate flash memory device of the flash memory subsystem 340. The interface controller 350 then accesses the appropriate flash memory device according to the access requests in the manner described above.

Figure 3:
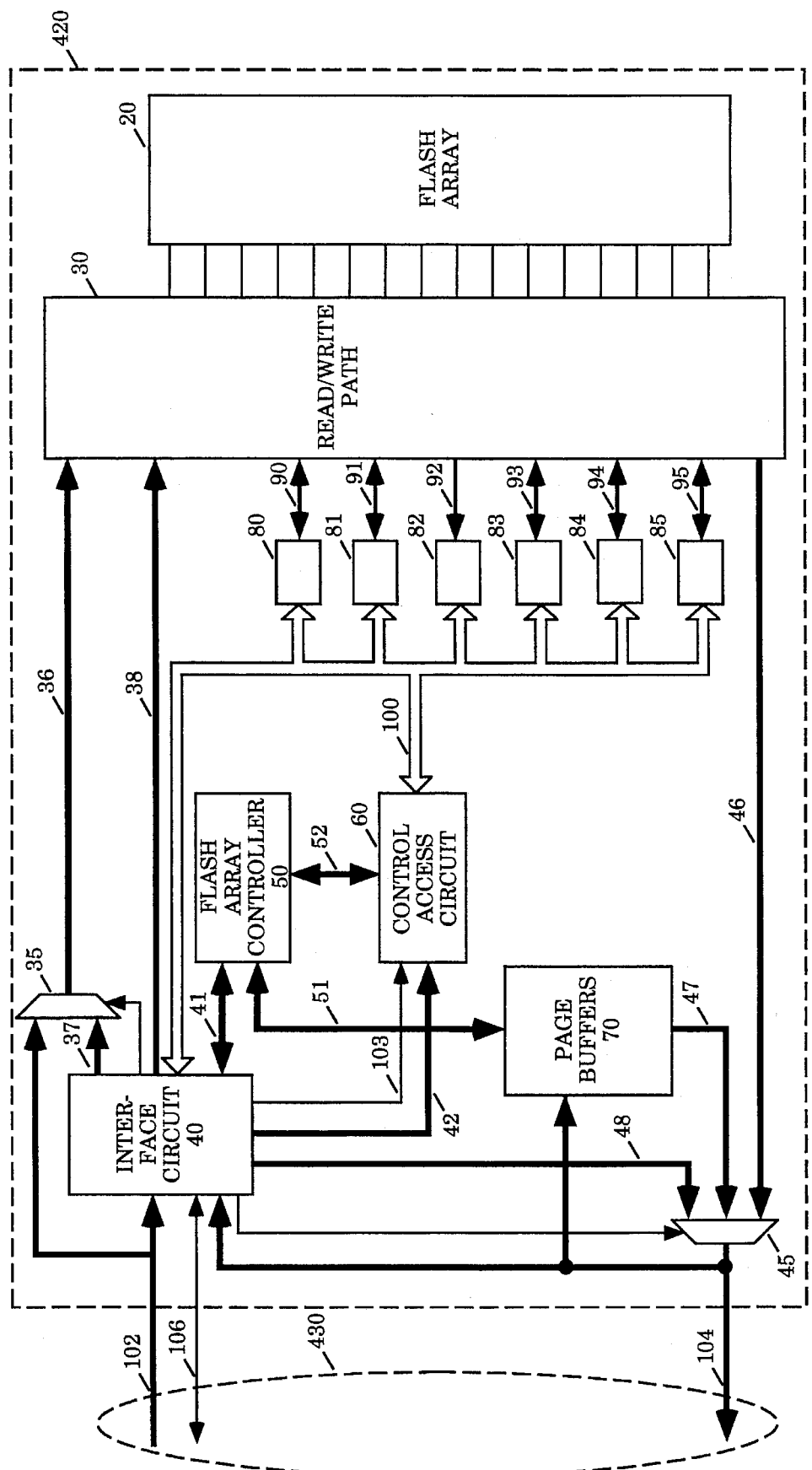
FIG. 3 is a block diagram of the flash memory device including a flash cell array, an interface circuit, a flash array controller, a set of page buffers, a set of control register circuits, and a set of read/write path circuitry.

FIG. 3 is a block diagram of the flash memory device 420. The flash memory device 420 is comprised of a flash cell array 20, an interface circuit 40, a flash array controller 50, a set of page buffers 70, a set of control register circuits 80–85, and a set of read/write path circuitry 30. The host bus 430 comprises an address bus 102, a data bus 104, and a control bus 106.

The flash cell array 20 provides random access non volatile large scale data storage. For one embodiment, the flash cell array 20 is arranged as a set of 32 flash cell blocks. Each flash cell block provides 64 k bytes of data storage.

The read/write path circuitry 30 comprises read and write path circuitry for accessing the flash array 20. For example, the read/write path circuitry 30 includes row and column address decoding circuitry for the flash array 20. The read/write path circuitry 30 also includes redundancy circuitry for overriding addresses if a bad flash cell is detected in the flash array 20. The read/write path circuitry 30 also includes mini array circuitry for generating reference flash bits, and sense path circuitry for comparing the reference flash bits to bits from the flash array 20 to determine whether the bits are logic state 1 or logic state 0.

The read/write path circuitry 30 also includes multiplexor circuitry for selecting between bits from the flash array 20 and redundant bits, as well as multiplexor circuitry for selecting between the high and low bytes of the flash array 20 to provide for 8 bit and 16 bit accesses. The read/write path circuitry 30 includes output buffer circuitry for driving data from the flash array 20 over output pads of the flash memory device 420.

The read/write path circuitry 30 includes address transition detection circuitry. The address transition detection circuitry generates control pulses when address transitions are detected. The control pulses are employed to speed column charging at the outputs of the flash array 20 before data is ready.

The read/write path circuitry 30 includes high voltage circuitry for accessing the flash array 20. For example, the read/write path circuitry 30 includes a programming wordline voltage (VPX) switching circuitry for setting the wordline voltage for programming data into the flash array 20, and a programming loadline voltage (VPY) generator circuitry for setting the programming load line. The read/write path circuitry 30 also includes an unselected source voltage (VSI) generator circuitry for setting the source voltage of unselected blocks of the flash array 20 during programming.

The read/write path circuitry 30 also includes digital to analog conversion circuits for generating reference voltage levels for program verify operations, as well as erase verify and post erase repair operations.

The read/write path circuitry 30 also includes a programming source voltage (VPS) switch circuitry for setting the source voltage level to a programming voltage (VPP) during erase operations.

The control register circuits 80–85 contain sets of specialized control registers and associated circuitry for controlling a read/write path 30. The specialized control registers are programmed and accessed over a central control bus 100. The control bus 100 enables reads and writes to the control register circuits 80–85.

The interface circuit 40 enables access of the flash cell array 20 over the host bus 430 by receiving and processing commands over the host bus 430. The interface circuit 40 receives commands over the data bus 104, verifies the commands, and queues the commands to the flash array controller 50 over a queue bus 41. Thereafter, the flash array controller 50 executes the command using the appropriate portion of the flash memory device 420.

The flash array controller 50 is a specialized reduced instruction set processor for performing write operations on the flash array 20. The flash array controller 50 includes an arithmetic logic unit, general purpose registers, a control store and a control sequencer. The flash array controller 50 uses the commands received over the queue bus 41 to dispatch to the appropriate location of the control store to execute the command.

A control access circuit 60 enables both the interface circuit 40 and the flash array controller 50 to access the control register circuits 80–85 over the central control bus 100. During a normal mode of the flash memory device 420, the flash array controller 50 controls the control access circuit 60 and accesses the control register circuits 80–85 over the central control bus 100.

The flash array controller 50 writes to the specialized control registers by transferring a write control signal, and a register address along with corresponding write data to the control access circuit 60 over a bus 52. The control access circuit 60 then generates a write cycle over the central control bus 100 to write to the addressed specialized control register. The flash array controller 50 reads the specialized control registers by transferring a register address and read control signal to the control access circuit 60 over the bus 52. The control access circuit 60 then generates a read access cycle over the central control bus 100 to read the addressed specialized control register.

The interface circuit 40 writes to the specialized control registers by transferring a write control signal and a strobe signal, along with a register address along and corresponding write data to the control access circuit 60 over a bus 42. The control access circuit 60 then generates a write cycle over the central control bus 100 to program the addressed specialized control register. The interface circuit 40 reads the specialized control registers by transferring a register address along with a read control signal and a strobe signal to the control access circuit 60 over the bus 42. The control access circuit 60 then generates a read access cycle over the central control bus 100 to read the addressed specialized control register.

The control register circuit 80 contains specialized control registers and circuitry for controlling the high voltage circuitry of the read/write path 30 according to a set of control signals 90. The high voltage control registers include source switch interface registers, interface registers for controlling VPX and another programming voltage associated with the wordlines (VPIX) multiplexors, VPP/VCC switch interface registers, interface registers for controlling reference generators, multiplexors and comparators, and programming data path interface registers.

The control register circuit 81 contains control registers and circuitry for controlling special column access circuitry of the read/write path 30 according to a set of control signals 91. The special column access control registers include mini-array interface registers, redundancy interface registers, imprint interface registers, and content addressable memory interface registers.

The control register circuit 82 contains a set of read only registers for sensing and latching a set of status signals 92 from the read/write path 30. The status signals 92 include the outputs of TTL buffers corresponding to input pads of the flash memory device 420, outputs of the sense amplifiers for the flash cell array 20, page buffer counter outputs, outputs of the comparators in the read/write path 30, and the flash array controller 50 program counter.

The control register circuit 83 contains control registers and circuitry for controlling the read path of the read/write path 30 according to a set of control signals 93. The read path control registers include automatic transition detection interface registers, sensing interface registers, x, y, and z path interface registers.

The control register circuit 84 contains interface registers to the flash array controller 50 and interface registers to the interface circuit 40. The control register circuit 85 contains registers for controlling special test features of the flash memory device 420 according to a set of control signals 95. The special test registers include test mode access registers, VPP capture registers, ready and busy modifier registers, and address allocation registers.

The interface circuit 40 controls an input address multiplexor 35 to select an input address 36 for the read/write path 30. The selected input address 36 is either the address sensed by TTL buffers (not shown) on the address bus 102, or a latched address 37 from the interface circuit 40. The input address 36 may be overridden by writing control registers in the control register circuit 84.

The interface circuit 40 controls an output data multiplexor 45 to select a source for output data transfer over the data bus 104. The selected output data is either flash array data 46 from the read/write path 30, page buffer data 47 from the page buffers 70, or block status register (BSR) data 48 from a set of block status registers contained within the interface circuit 40.

The page buffers 70 provide buffer storage areas for write sequences to the flash array 20 over the data bus 104. The page buffers 70 also provide a temporary control store area for the flash array controller 50. For one embodiment, the page buffers 70 are arranged as a set of two 256×8 bit page buffers.

The CPU 410 reads the flash cell array 20 by transferring addresses over the address bus 102 while signaling read cycles over the control bus 106. The interface circuit 40 detects the read cycles and causes the input address multiplexor 35 to transfer the addresses from the address bus 102 through to the x and y decode circuitry of the read/write path 30. The interface circuit 40 also causes the output data multiplexor 45 to transfer the addressed read data from the read/write path 30 over the data bus 104.

The CPU 410 writes data to the flash cell array 20 by generating write cycles over the host bus 430 to transfer write data blocks to the page buffers 70. The interface circuit 40 verifies the write command, and queues the write command to the flash array controller 50. The flash array controller 50 executes the write command by reading the write data from the data queue, and by programming the write data into appropriate areas of the flash array 20.

The flash array controller 50 implements algorithms for sequencing the high voltage circuitry of the read/write path 30 in order to apply charge to the flash cells of the flash cell array 20 and remove charge from the flash cells of the flash cell array 20. The flash array controller 50 controls the high voltage circuitry and addresses the flash array 20 by accessing the control register circuits 80–85 over the central control bus 100.

The read/write path 30 includes source switch circuitry for applying the appropriate voltage levels to the flash cell array 20 for an erase function. The read/write path 30 also includes program load circuitry for driving program level voltages onto the bit lines of the flash cell array 20 during a programming function.

The interface circuit 40 contains 32 block status registers. Each block status register corresponds to one of the blocks of the flash cell array 20. The flash array controller 50 transfers information into the block status registers to indicate the status of each block of the flash cell array 20. The CPU 410 reads the contents of the block status registers over the host bus 430.

The address bus 102, the data bus 104, and the control bus 106 are coupled to input/output pins (not shown) of the flash memory device 420. The input/output pins include a write protect pin. The write protect pin is used to enable and disable the write protect mechanism of the flash memory device 420.

The CPU 410 enables and disables the write protection mechanism of the flash memory device 420 by transferring a control signal to the write protect pin over the control bus 106. For one embodiment, a logic state zero applied to the write protect pin enables the write protection mechanism. A logic state one applied to the write protect pin disables the write protection mechanism.

Figure 4:
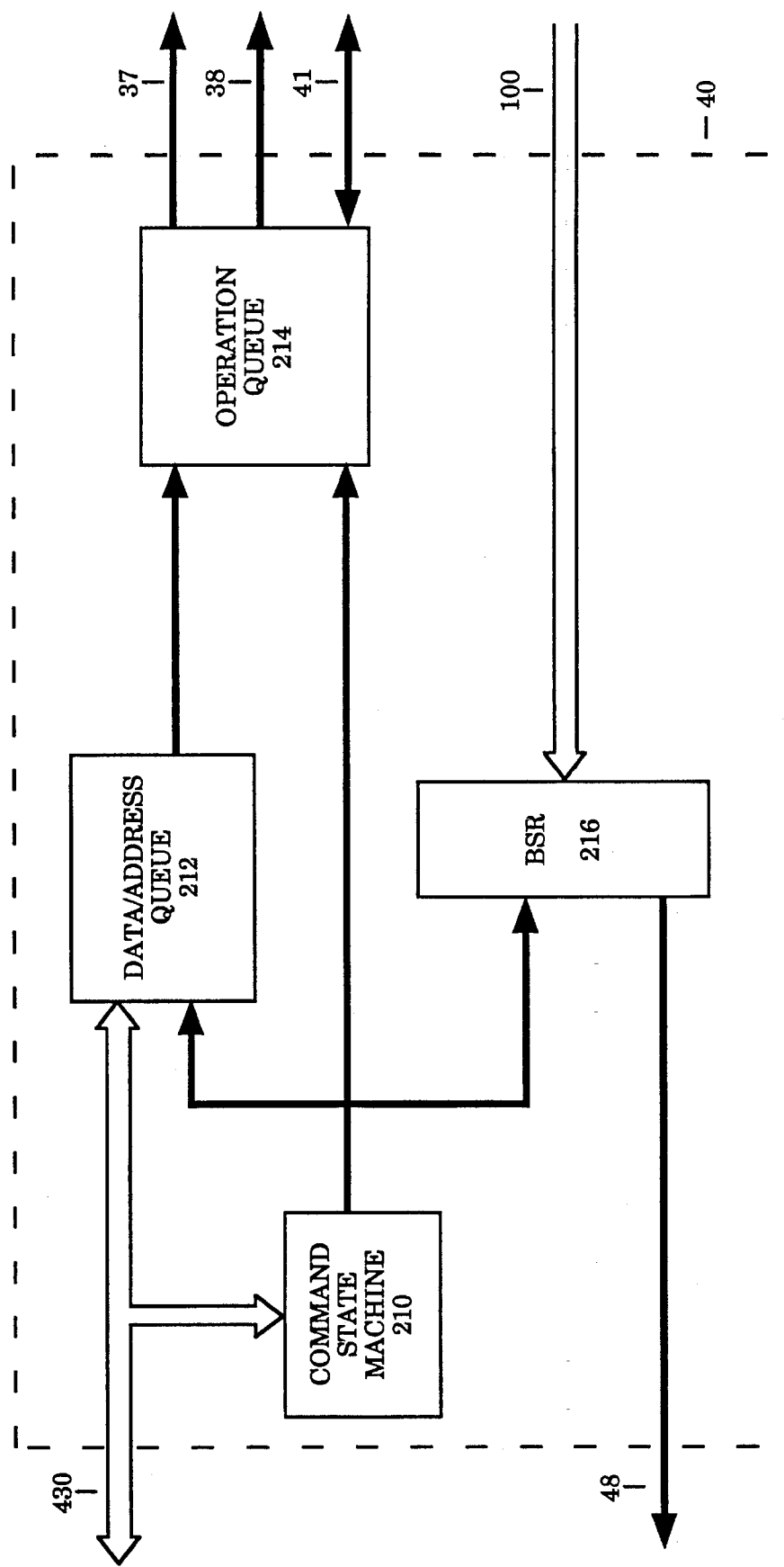
FIG. 4 is a block diagram of the interface circuit comprising a command state machine, a data/address queue, an operation queue, and a set of block status registers (BSR)

FIG. 4 is a block diagram of the interface circuit 40. The interface circuit 40 is comprised of a command state machine 210, a data/address queue 212, an operation queue 214, and a set of block status registers (BSR) 216.

The command state machine 210 receives commands from the CPU 410 over the host bus 430. The commands from the CPU 410 include commands for performing program and erase operations of the flash array 20. The command state machine 210 verifies the commands, and transfers commands and associated parameters to the flash array controller 50 through the operation queue 214.

The operation queue 214 transfers the latched addresses 37 from the data/address queue 212 to the input multiplexor 35. The operation queue 214 also transfers the latched array data 38 from the data/address queue 212 to the read/write path 30. The operation queue 214 transfers the verified commands and associated parameters to the flash array controller 50 over the queue bus 41.

The BSR 216 contains a block status register for each of the flash cell blocks of the flash array 20. Each block status register in the BSR 216 provides status information for the corresponding flash cell block. The flash array controller 50 maintains status bits in the block status registers. The interface circuit 40 enables access of the block status registers over the host bus 430.

For one embodiment, the BSR 216 is arranged as a dual-port static random access memory (SRAM). The BSR 216 is comprised of a set of 32 block status registers. Each block status register is eight bits wide.

The flash array controller 50 accesses the block status registers in the BSR 216 over the central control bus 100. The flash array controller 50 performs both reads and writes to the BSR 216 over the central control bus 100.

The CPU 410 reads the block status registers of the BSR 216 by transmitting a read block status register command to the command state machine 210 over the host bus 430. The read block status register command includes a 5 bit BSR address for selecting one of the 32 block status registers in the BSR 216. The 5 bit BSR address selects one of the block status registers the BSR 216. Thereafter, the contents of the selected block status register are transferred from the BSR 216 to the output multiplexor 45 over the BSR data 48. The command state machine 210 causes the output multiplexor 45 to transfer the BSR data 48 over the data bus 104.

For one embodiment, bit 6 of each block status register in the BSR 216 is a block enabled flag indicating whether the corresponding flash cell block is locked. If the block enabled flag is a logic state 0, the flash array controller 50 is inhibited from performing program/erase operations on the corresponding flash cell block if the write protection mechanism of the flash memory device 420 is enabled. Upon power up of the flash memory device 420, all 32 of the block enabled flags in the BSR 216 are set to the logic state 0.

Figure 5A:
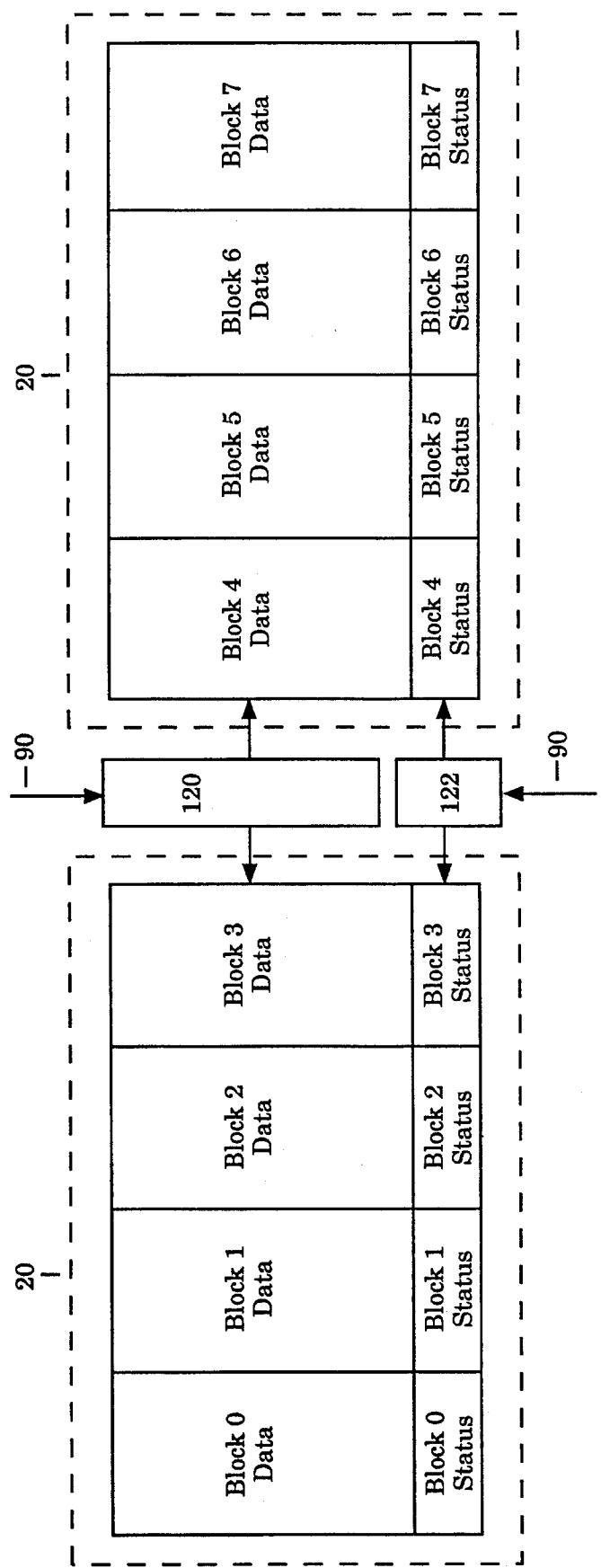
FIG. 5a illustrates the architecture of a portion of the flash array which shows a subset of the flash cell blocks (BLOCKS 0–7), wherein each flash cell block is comprised of a block data area and a block status area.

FIG. 5a illustrates the architecture of a portion of the flash array 20, and shows a subset of the flash cell blocks (BLOCKS 0–7). Each flash cell block BLOCK 0–7 is comprised of a block data area and a block status area. For example, the flash cell block BLOCK 0 is comprised of a block zero data area (BLOCK 0 DATA) and a block zero status area (BLOCK 0 STATUS).

Each block data area provides a random access non-volatile user data storage area in the memory device 420. For one embodiment, each block data area is comprised of 1,024 rows by 512 columns of flash cells.

Each block status area provides a random access non-volatile status information storage area for the corresponding block data area. For one embodiment, each block status area is comprised of two rows by 64 columns of flash cells.

Each block status area includes a lock bit stored in a lock cell. Each lock bit indicates whether the corresponding block data area is locked. If the lock bit indicates that the corresponding block data area is locked, the flash array controller 50 is inhibited from performing a program/erase operation on the locked flash cell block if the write protection mechanism is enabled. For one embodiment, a lock bit having a logic state 0 indicates the corresponding flash cell block is locked.

Each block status area also stores a cycle count for program operations on the corresponding block data area, a count of the number of pulses during the last erase operations to the corresponding block data area, as well as failure analysis data.

A block data row decoder 120 selects the appropriate row of the block data areas according to the input address through the read/write path 30. The block data row decoder 120 selects the rows of the block data areas during normal read/write accesses of the user data stored in the flash array 20, and during block data accesses by the flash array controller 50.

A block status row decoder 122 selects the appropriate rows of the block status areas according to a status row address from the flash array controller 50 through the read/write path 30. The block status row decoder 122 selects the rows of the block status areas during block status area accessed by the flash array controller 50.

The block data row decoder 120 and the block status row decoder 122 receive the control signals 90 from the control register circuit 80. The control signals 90 selectively enable and disable the block data row decoder 120 and the block status row decoder 122.

The flash array controller 50 writes control registers in the control register circuit 80 over the central control bus 100 to generate the control signals 90. The flash array controller 50 programs the control registers to enable the block data row decoder 120 if the block data areas of the flash array 20 are being accessed. The flash array controller 50 loads the control registers to enable the block status row decoder 122 if the block status areas of the flash array 20 are being accessed.

Figure 5B:
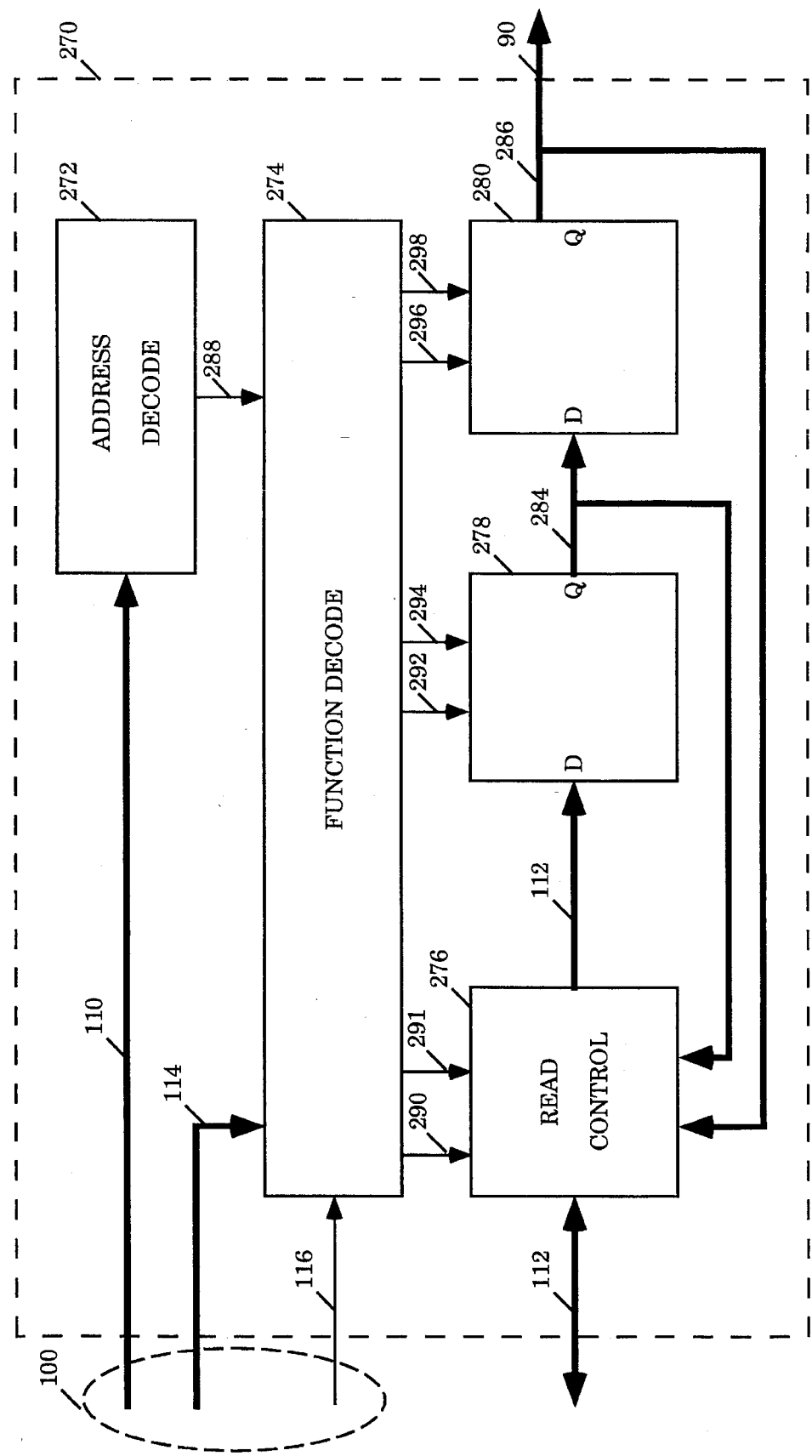
FIG. 5b illustrates a control register contained in a control register circuit which generates the control signals for selectively enabling and disabling the block data row decoder and the block status row decoder.

FIG. 5b illustrates a control register 270 contained in the control register circuit 80. The control register 270 generates the control signals 90 for selectively enabling and disabling the block data row decoder 120 and the block status row decoder 122. The control register 270 is comprised of an address decode circuit 272, a function decode circuit 274, a read control circuit 276, and a pair of data latches 278 and 280. The data latch 278 is a master data latch, and the data latch 280 is a slave data latch.

The central control bus 100 comprises a flash I/O address (FIOADD) bus 110, a flash I/O data (FIODAT) bus 112, a flash I/O control (FIOCTL) bus 114, and a strobe signal 116. The control register 270 is selected by an address on the FIOADD bus 110. Data is transferred to the control register 270 over the FIODAT bus 112. An access mode for the control register 270 is indicated on the FIOCTL bus 114, and data transfer is synchronized by the strobe signal 116.

The address decode circuit 272 receives and decodes addresses received over the FIOADD bus 110, and generates a control signal 288 if the address corresponds to the control register 270. The control signal 288 causes the function decode circuit 274 to decode the access mode on the FIOCTL bus 114 and perform the specified access mode function.

The access modes are read master, read slave, reset master, reset slave, reset both master and slave, load master, transfer master to slave, and load master/transfer to slave.

The access modes of read master, read slave, load master, and load master/transfer to slave operate on individual control registers and require an address to be provided on the FIOADD bus 110. The remaining access modes operate globally on all control registers coupled to the central control bus 100 and do not require an address to be provided on the FIOADD bus 110. The load master and load slave access modes require data to be provided on the FIODAT bus 112. The read master and read slave access modes drive data on to the FIODAT bus 112. The access modes of load master, and load master/transfer to slave are synchronized by the strobe signal 116.

If the FIOCTL bus 114 specifies the read master access mode, the function decode circuit 274 issues a control signal 290 which causes the read control circuit 276 to transfer the output 284 of the master data latch 278 over the FIODAT bus 112.

If the FIOCTL bus 114 specifies the read slave access mode, the function decode circuit 274 issues a control signal 291 which causes the read control circuit 276 to transfer the output 286 of the slave data latch 280 over the FIODAT bus 112.

If the FIOCTL bus 114 specifies the reset master access mode, the function decode circuit 274 issues a control signal 294 which causes the master data latch 278 to reset. If the FIOCTL bus 114 specifies the reset slave access mode, the function decode circuit 274 issues a control signal 298 which causes the slave data latch 280 to reset. If the FIOCTL bus 114 specifies the reset both master and slave access mode, the function decode circuit 274 issues the control signals 294 and 298 to reset the master and slave data latches 278 and 280.

If the FIOCTL bus 114 specifies the load master access mode, the function decode circuit 274 issues a control signal 292 which causes the master data latch 278 to load from the FIODAT bus 112.

If the FIOCTL bus 114 specifies the transfer master to slave access mode, the function decode circuit 274 issues a control signal 296 which causes the slave data latch 280 to load from the output 284 of the master data latch 278.

If the FIOCTL bus 114 specifies the load master/transfer to slave access mode, the function decode circuit 274 issues the control signal 292 which causes the master data latch 278 to load from the FIODAT bus 112. The function decode circuit 274 also issues the control signal 296 which causes the slave data latch 280 to load from the output 284 of the master data latch 278.

The CPU 410 locks the flash cell blocks of the flash array 20 by transferring lock control commands to the interface circuit 40 over the host bus 430. Each lock control command specifies one of the flash cell blocks of the flash array 20. The command state machine 210 queues the lock control commands to the flash array controller 50 through the operation queue 214.

The flash array controller 50 executes the lock flash block command by loading the control registers in the control register circuit 80 to disable the block data row decoder 120 and to enable the block status row decoder 122. The flash array controller 50 then addresses the block status area of the flash cell block specified in the lock flash block command. The flash array controller 50 then sets the lock bit in the block status area to a logic state 1. Thereafter, the flash array controller 50 loads the control registers of the control register circuit 80 to disable the block status row decoder 122 and to enable the block data row decoder 120 for normal accessing of the flash array 20.

The CPU 410 releases locks on the flash cell blocks of the flash array 20 by transferring an erase command targeted for the appropriate flash cell block to the interface circuit 40 over the host bus 430 while driving the write protect pin to a "1". The erase flash block command specifies the flash cell block. The command state machine 210 queues the erase flash block command to the flash array controller 50. The flash array controller 50 executes the erase flash block command by erasing the data and block status areas of the flash cell block.

Alternatively, the CPU 410 can concurrently erase and release locks on flash cell blocks of the flash array 20. The CPU 410 first drives the write protect pin of the flash memory device 420 to a logic state 1 to disable the write protect mechanism. Thereafter, the CPU 410 transfers an erase flash cell block command to the interface circuit 40. The erase flash cell block command specifies a flash cell block in the flash array 20. The interface circuit 40 queues the erase flash cell block command to the flash array controller 50.

The flash array controller 50 executes the erase flash cell block command by performing an erase operation on the specified flash cell block, including the block data area and the block status area. The erase of the block status area clears the lock cell to a logic state 1, thereby effectively releasing the flash cell block. The CPU 410 then drives the write protect pin of the flash memory device 420 to a logic state 0 to reenable the write protection mechanism.

Figure 6A:
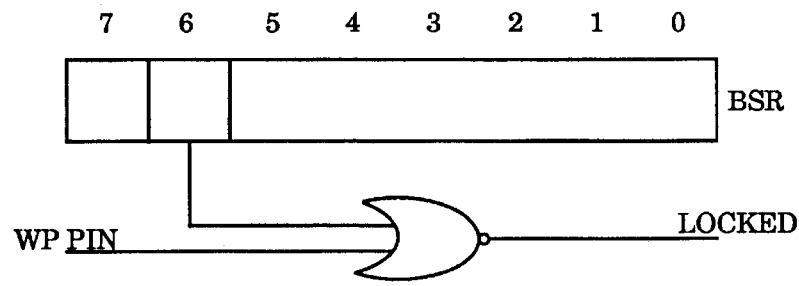
FIG. 6a illustrates the operation of logic in the flash memory device that generates a LOCKED hardware flag which is tested as a hardware branch condition by the flash array controller.

FIG. 6a illustrates the operation of logic in the flash memory device 420 that generates a LOCKED hardware flag. The LOCKED hardware flag is tested as a hardware branch condition by the flash array controller 50. The LOCKED hardware flag is generated by a combination of the logic state of the write protect pin of the flash memory device 420 and the block enabled flags in the block status registers of the BSR 216.

The LOCKED hardware flag is generated by a NOR function of the block enabled flag corresponding to the flash cell block specified for the program/erase operation with the input from the write protect pin (WP PIN) of the flash memory device 420.

The LOCKED hardware flag is logic state 0 if either the block enabled flag is set or the write protect mechanism is disabled. The LOCKED hardware flag is logic state 1 if the block enabled flag is clear and the write protect mechanism is enabled. The LOCKED hardware flag is tested by the flash array controller 50 when performing a program or erase operation on the flash array 20.

Figure 6B:
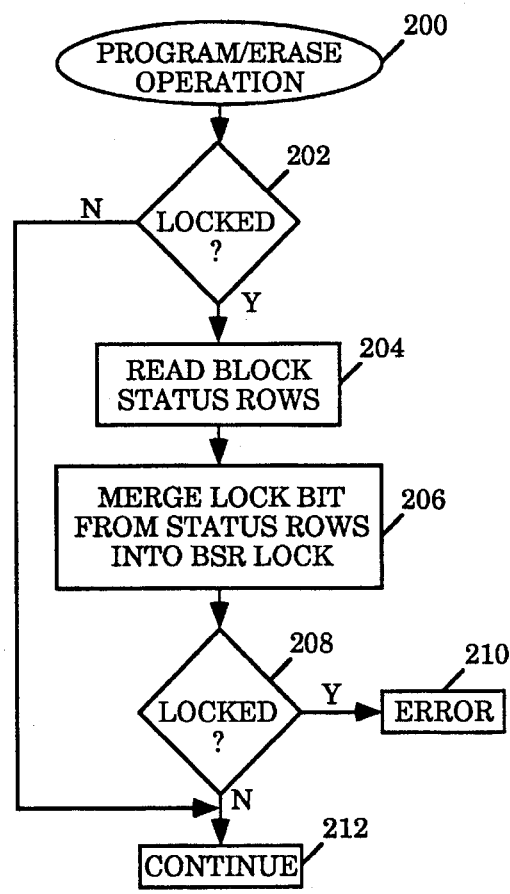
FIG. 6b is a flow diagram illustrating the interaction between the LOCKED hardware flag and the execution of a program/erase operation by the flash array controller.

FIG. 6b is a flow diagram illustrating the interaction between the LOCKED hardware flag and the execution of a program/erase operation by the flash array controller 50.

At state 200, the flash array controller 50 dispatches a program or erase operation in response to a command received from the interface circuit 40. At decision state 202, the flash array controller 50 tests the LOCKED hardware flag. If the LOCKED hardware flag is not set to logic state 1, then control proceeds to state 212 to continue the program/erase operation.

If the LOCKED hardware flag is set to 1 at the decision state 202, then control proceeds to state 204. At the state 204, the flash array controller 50 reads the block status area of the selected flash cell block. Thereafter at state 206, the flash array controller 50 merges the lock bit from the block status area into the block enabled flag of the block status register in the BSR 216. The flash array controller 50 accesses the selected block status register in the BSR 216 over central control bus 100 through the control access circuit 60.

Thereafter, at decision state 208, the flash array controller 50 again tests the LOCKED hardware flag. If the LOCKED hardware flag is still set to 1 at the state 208, control proceeds to the state 210 to signal an error. An error is signaled because a program/erase operation was attempted on a locked flash cell block of the flash array 20. If the LOCKED hardware flag is not set at the decision state 208, then control proceeds to the state 212 to continue the program/erase function.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A method for selectively locking write access to a block of a flash cell array in a flash memory device, comprising the steps of:

receiving a lock command over a host bus, the lock command specifying the block of the flash cell array from among at least one available block in the flash cell array;

disabling a block data row decoder for a block data area of the block, and enabling a block status row decoder for a block status area of the block;

programming a lock cell in the block status area to a first logic state, such that the first logic state of the lock cell indicates that the block has a write access lock;

receiving a write command targeted for the block, the write command to specifying a program or erase operation on the block;

sensing a write protect input from a write protect pin of the flash memory device, the write protect input indicating whether the write access lock is enabled or disabled;

if the write protect input indicates that the write access lock is enabled, and if a block enabled status bit in a block status register corresponding to the block indicates that the block has the write access lock, then reading a lock bit from the lock cell and storing the lock bit into the block enabled status bit in the block status register corresponding to the block;

sensing the write protect input from the write protect pin of the flash memory device;

if the write protect input indicate that the write access lock is enabled, and if the block enabled status bit in the block status register corresponding to the block indicates that the block has the write access lock, then signaling an error.

2. The method of claim 1, wherein the step of disabling a block data row decoder for a block data area of the block, and enabling a block status row decoder for a block status area of the block comprises the step of loading a control register over a central control bus, the control register generating a disable signal for the block data row decoder and an enable signal for the block status row decoder.

3. The method of claim 1, further comprising the step of performing the program or erase operation on the block if the write protect input indicates that the write access lock is disabled or if the block enabled status bit in the block status register corresponding to the block indicates that the block does not have the write access lock.

4. The method of claim 3, wherein an erase operation on the block releases the write access lock on the block by erasing the lock cell.

5. The method of claim 3, wherein a power-on sequence in the flash memory device sets the block enabled status bit in the block status register to indicate that the block has the write access lock.

6. The method of claim 1, wherein the step of reading a lock bit from the lock cell comprises the steps of:

disabling the block data row decoder for the block data area of the block, and enabling the block status row decoder for the block status area of the block;

reading the lock cell in the block status area, the lock cell storing the lock bit.

7. The method of claim 1, wherein the step of storing the lock bit into the block enabled status bit of the block status register corresponding to the block comprises the step of loading the block status register over a central control bus.

8. A circuit for selectively locking write access to a block of a flash cell array in a flash memory device, comprising:

circuit for receiving a lock command over a host bus, the lock command specifying the block of the flash cell array from among at least one available block in the flash cell array;

circuit for disabling a block data row decoder for a block data area of the block, and enabling a block status row decoder for a block status area of the block;

circuit for programming a lock cell in the block status area to a first logic state, such that the first logic state of the lock cell indicates that the block has a write access lock;

circuit for receiving a write command targeted for the block, the write command specifying a program or erase operation on the block;

circuit for sensing a write protect input from a write protect pin of the flash memory device, the write protect input indicating whether the write access lock is enabled or disabled;

circuit for reading a lock bit from the lock cell and storing the lock bit into a block enabled status bit in a block status register corresponding to the block if the write protect input indicates that the write access lock is enabled, and if the block enabled status bit in the block status register corresponding to the block indicates that the block has the write access lock;

circuit for signaling an error if the write protect input indicates that the write access lock is enabled, and if the block enabled status bit in the block status register corresponding to the block indicates that the block has the write access lock.

9. The circuit of claim 8, wherein the circuit for disabling a block data row decoder for a block data area of the block, and enabling a block status row decoder for a block status area of the block comprises circuit for loading a control register over a central control bus, the control register generating a disable signal for the block data row decoder and an enable signal for the block status row decoder.

10. The circuit of claim 8, further comprising circuit for performing the program or erase operation on the block if the write protect input indicates that the write access lock is disabled or if the block enabled status bit in the block status register corresponding to the block indicates that the block does not have the write access lock.

11. The circuit of claim 10, wherein an erase operation on the block releases the write access lock on the block by erasing the lock cell.

12. The circuit of claim 10, wherein a power-on sequence in the flash memory device sets the block enabled status bit in the block status register to indicate that the block has the write access lock.

13. The circuit of claim 8, wherein the circuit for reading a lock bit from the lock cell comprises:

circuit for disabling the block data row decoder for the block data area of the block, and enabling the block status row decoder for the block status area of the block;

circuit for reading the lock cell in the block status area, the lock cell storing the lock bit.

14. The circuit of claim 8, wherein the circuit for storing the lock bit into the block enabled status bit of the block status register corresponding to the block comprises circuit for loading the block status register over a central control bus.

15. A flash memory device, comprising:

a flash cell array comprising a block, the block comprising a block data area and a block status area, the block status area comprising a lock cell indicating whether the block has a write access lock;

a block status register circuit comprising a block status register, the block status register storing a block enabled status bit for the block;

a circuit for sensing a write protect input from a write protect pin of the flash memory device the write protect input indicating whether the write access lock is enabled or disabled:

a flash array controller circuit receiving a program or erase command over a host bus targeted for the block, the flash array controller circuit reading a lock bit from the lock cell and storing the lock bit into the block enabled status bit in the block status register for the block after receiving the program or erase command, the flash array controller signaling an error if the write protect input indicates that the write access lock is enabled and if the block enabled status bit in the block status register for the block indicates that the block has the write access lock.

16. The flash memory device of claim 15, wherein the flash memory device performs the program or erase operation on the block if the write protect input indicates that the write access lock is disabled or if the block enabled status bit in the block status register corresponding to the block indicates that the block does not have the write access lock.

17. The flash memory device of claim 15, wherein an erase operation on the block releases the write access lock on the block by erasing the lock cell.

18. The flash memory device of claim 15, wherein a power-on sequence in the flash memory device sets the block enabled status bit in the block status register to indicate that the block has the write access lock.

19. The flash memory device of claim 15, wherein the block status area further comprises a set of status cells storing a cycle count indicating a number of program operations on the block.

20. The flash memory device of claim 15, wherein the block status area further comprises a set of pulse count cells storing a pulse count indicating a number of pulses during a last erase operation on the block.

21. A computer system, comprising:

main memory means storing a set of write data for a program operation;

central processing means reading the write data from the main memory means and transferring a write command and the write data over a host bus;

circuit for inhibiting the program operation to a block of a non-volatile memory cell array by maintaining a lock cell, the circuit for inhibiting comprising:

circuit for sensing a write protect input from a write protect pin coupled to the host bus, the write protect input indicating whether the write access lock is enabled or disabled;

circuit for reading a lock bit from the lock cell and storing the lock bit into a block enabled status bit in a block status register corresponding to the block if the write protect input indicates that the write access lock is enabled, and if the block enabled status bit in the block status register corresponding to the block indicates that the block has the write access lock.

22. The computer system of claim 21, wherein the circuit for inhibiting the program operation to a block of a flash cell array comprises:

circuit for receiving a lock command over the host bus, the lock command specifying the block of the flash cell array;

circuit for disabling a block data row decoder for a block data area of the block, and enabling a block status row decoder for a block status area of the block;

circuit for programming the lock cell to a first logic state, such that the first logic state of the lock cell indicates that the block has the write access lock.

23. The computer system of claim 22, wherein the circuit for disabling a block data row decoder for a block data area of the block, and enabling a block status row decoder for a block status area of the block comprises circuit for loading a control register over a central control bus, the control register generating a disable signal for the block data row decoder and an enable signal for the block status row decoder.

24. The computer system of claim 22, wherein the circuit for inhibiting the program operation to a block of a flash cell array further comprises:

circuit for signaling an error if the write protect input indicates that the write access lock is enabled, and if the block enabled status bit in the block status register corresponding to the block indicates that the block has the write access lock.

25. The computer system of claim 24, wherein the circuit for inhibiting the program operation to a block of a flash cell array further comprises a circuit for performing the program operation on the block if the write protect input indicates that the write access lock is disabled or if the block enabled status bit in the block status register corresponding to the block indicates that the block does not have the write access lock.

26. The computer system of claim 22, wherein an erase operation on the block releases the write access lock on the block by erasing the lock cell.

27. The computer system of claim 22, wherein a power-on sequence sets the block enabled status bit in the block status register to indicate that the block has the write access lock.

28. A computer system, comprising:

main memory means storing a set of write data for a program operation;

central processing means reading the write data from the main memory means and transferring a write command and the write data over a host bus;

a flash memory device inhibiting the program operation to a block of a flash cell array by maintaining a lock bit in a block status area of the block, the flash memory device comprising:

a block status register circuit having a block status register, the block status register storing a block enabled status bit for the block;

a circuit for sensing a write protect input;

a flash array controller circuit receiving the write command over the host bus targeted for the block, the flash array controller circuit reading the lock bit and storing the lock bit into the block enabled status bit in the block status register for the block after receiving the write command or an erase command, the flash array controller circuit performing the program operation on the block if the write protect input indicates that a write access lock is disabled or if the lock bit indicates that the block does not have a write access lock the flash array controller circuit signaling an error if the write protect input indicates that the write access lock is enabled and the block enabled status bit in the block status register for the block indicates that the block bas the write access lock.

29. The computer system of claim 28, wherein the flash memory device performs the program operation or an erase operation on the block if the write protect input indicates that the write access lock is disabled or if the block enabled status bit in the block status register corresponding to the block indicates that the block does not have the write access lock.

30. The computer system of claim 28, wherein the erase operation on the block releases the write access lock on the block by erasing the lock cell.

31. The computer system of claim 28, wherein a power-on sequence in the flash memory device sets the block enabled status bit in the block status register to indicate that the block has the write access lock.

32. The computer system of claim 28, wherein the block status area further comprises a set of status cells storing a cycle count indicating a number of program operations on the block.

33. The computer system of claim 28, wherein the block status area further comprises a set of pulse count cells storing a pulse count indicating a number of pulses during a last erase operation on the block.

34. A method for detecting whether a block in a memory array is write protected, the method comprising the steps of:

testing a flag to determine if the flag indicates that the block is write protected, the flag indicating that the block is write protected if a block enabled bit in a block Status register indicates the block is write protected and a write protect input is enabled;

if the flag indicates that the block is write protected, then reading a block status from the memory array;

updating the block enabled bit in the block status register from the block status;

testing the flag to determine if the block is write protected; and signaling an error if the block is write protected.

35. The method of claim 34 wherein the memory array is a non-volatile memory array and the block enabled bit is stored in a volatile memory.

* * * * *

UNITED STATES PATENT AND TRADEMARK OFFICE
CERTIFICATE OF CORRECTION

PATENT NO. : 5,592,641
DATED : January 7, 1997
INVENTOR(S) : Fandrich et al.

It is certified that error appears in the above-indentified patent and that said Letters Patent is hereby corrected as shown below:

In column 11 at line 32 delete "to"

In column 11 at line 47 delete "indicate" and insert --indicates--

In column 15 at line 16 delete "bas" and insert --has--

In column 16 at line 16 delete "Status" and insert --status--

Signed and Sealed this

Fifteenth Day of July, 1997

Attest:

BRUCE LEHMAN

Attesting Officer

Commissioner of Patents and Trademarks